(12) United States Patent
Panto et al.

(10) Patent No.: US 6,522,256 B2
(45) Date of Patent: Feb. 18, 2003

(54) HYBRID CURRENT AND VOLTAGE SENSING SYSTEM

(75) Inventors: Andrew S. Panto, Matthews, NC (US); Mike Smith, Matthews, NC (US); Steve Gagne, Matthews, NC (US)

(73) Assignee: Southern Electric Equipment, Charlotte, NC (US)

( * ) Notice: Subject to any disclaimer, the term of this patent is extended or adjusted under 35 U.S.C. 154(b) by 0 days.

(21) Appl. No.: 09/854,898

(22) Filed: May 15, 2001

(65) Prior Publication Data

US 2002/0000802 A1 Jan. 3, 2002

Related U.S. Application Data

(60) Provisional application No. 60/204,589, filed on May 16, 2000.

(51) Int. Cl.⁷ .............................................. G08B 21/00
(52) U.S. Cl. ........................ 340/660; 340/664; 340/635; 361/31; 361/33
(58) Field of Search ................................ 340/660, 664, 340/658, 635, 661, 647; 361/59, 92, 93, 79, 23, 24, 31, 33, 44, 47; 324/133, 51, 508

(56) References Cited

U.S. PATENT DOCUMENTS

| | | | | |
|---|---|---|---|---|
| 5,442,280 A | * | 8/1995 | Baudart | |
| 5,673,196 A | * | 9/1997 | Hoffman et al. | 364/483 |
| 5,874,900 A | * | 2/1999 | Panto | |
| 5,902,963 A | * | 5/1999 | Chappaz et al. | |
| 5,959,537 A | * | 9/1999 | Banting et al. | 340/664 |
| 5,977,487 A | * | 11/1999 | Kuhl | |
| 6,215,940 B1 | * | 4/2001 | Johnson | |
| 6,246,332 B1 | * | 6/2001 | Hubbard | 340/658 |

* cited by examiner

*Primary Examiner*—Anh La
(74) *Attorney, Agent, or Firm*—Nixon & Vanderhye P.C.

(57) ABSTRACT

A system and method for sensing current and/or voltage in a utility system including a plurality of power lines. In particular, a central controller is in communication with and enables a phase-to-phase relationship among current and voltage sensing units for a plurality of different power lines.

18 Claims, 3 Drawing Sheets

HYBRID CURRENT AND VOLTAGE SENSING SYSTEM

This application claims priority on U.S. Provisional Patent Application No. 60/204,589, filed May 16, 2000, the disclosure of which is hereby incorporated herein by reference.

This application relates to a system for sensing current and/or voltage in a utility system including a plurality of power lines. In particular, this invention relates to a system (and corresponding method) including a central controller which enables monitoring of current and/or voltage on a plurality of different power lines (or phases) at the same time.

BACKGROUND OF THE INVENTION

Overhead power lines typically operate in a three-phase system, with each phase disposed on the pole or tower in spaced relation to the other two phases. A different power line is typically utilized for each different phase. U.S. Pat. No. 5,874,900, hereby incorporated herein by references, discloses an example of a three-phase power line system.

Utilities desire the ability to monitor the current and/or voltage in such power lines. There exists a need in the art for a more efficient system and/or method for monitoring current and/or voltage in such power lines. It is a purpose of this invention to fulfill this need, as well as other needs which will become apparent to those skilled in the art upon reviewing this document.

SUMMARY OF THE INVENTION

Generally speaking, certain example embodiments of this invention fulfill one or more of the above-listed needs by providing a method of sensing current, the method comprising:

providing a current sensing unit for a phase to be monitored;

the current sensing unit sensing a current of the phase and converting analog current data to digital current data;

forwarding the digital current data to a potential sensing unit via at least one optical interface; and transmitting the digital current data from the potential sensing unit to a control unit via at least one communications interface.

Other example embodiments of this invention fulfill one or more of the above-listed needs by providing a system for simultaneously sensing current and voltage for a plurality of different phases, the system comprising:

a first current sensing unit and a first voltage sensing unit for a first power line to be monitored, wherein said first current sensing unit and said first voltage sensing unit communicate with one another optically;

said first current sensing unit mounted proximate a first end of a first high voltage insulator and said first voltage sensing unit mounted proximate a second end of said first high voltage insulator so that said first current sensing unit senses current of said first power line and said first voltage sensing unit senses voltage of said first power line;

a second current sensing unit and a second voltage sensing unit for a second power line to be monitored, wherein said second current sensing unit and said second voltage sensing unit communicate with one another optically;

said second current sensing unit mounted proximate a first end of a second high voltage insulator and said second voltage sensing unit mounted proximate a second end of said second high voltage insulator so that said second current sensing unit senses current of said second power line and said second voltage sensing unit senses voltage of said second power line;

a controller in communication with each of said first and second current sensing units and each of said first and second voltage sensing units; and wherein said controller outputs sampling signals to each of said first and second current sensing units and each of said first and second voltage sensing units so that current and voltage measurements are simultaneously monitored in a common time relationship.

BRIEF DESCRIPTION OF THE INVENTION

DETAILED DESCRIPTION OF CERTAIN EXAMPLE EMBODIMENTS OF THE INVENTION

This invention relates to a system and corresponding method capable of simultaneously monitoring current and/or voltage in a plurality of different phases (e.g., three phases) of a power system such as in the context of a utility operated system. While three different phases is referred to herein, this number is for purposes of example and the instant invention may be used in monitoring one phase, two phases, or more than three phases simultaneously in different embodiments of this invention. For purposes of example only and without limitation, certain embodiments of the instant invention may be utilized to measure current and/or voltage in different phases of an overhead power line system. In certain example embodiments, a central or common controller and output unit is in communication with current/voltage monitoring units for each of the different phases, and enables all phases to be monitored in a common time relationship. For each of the multiple phases, a separate current/voltage sensor including both analog and digital circuitry is provided and mounted on a high voltage insulator corresponding to that phase. In certain embodiments of this invention, the system may be configured to monitor current only, voltage only, or both, for each of the plurality of phases.

Figure 1:
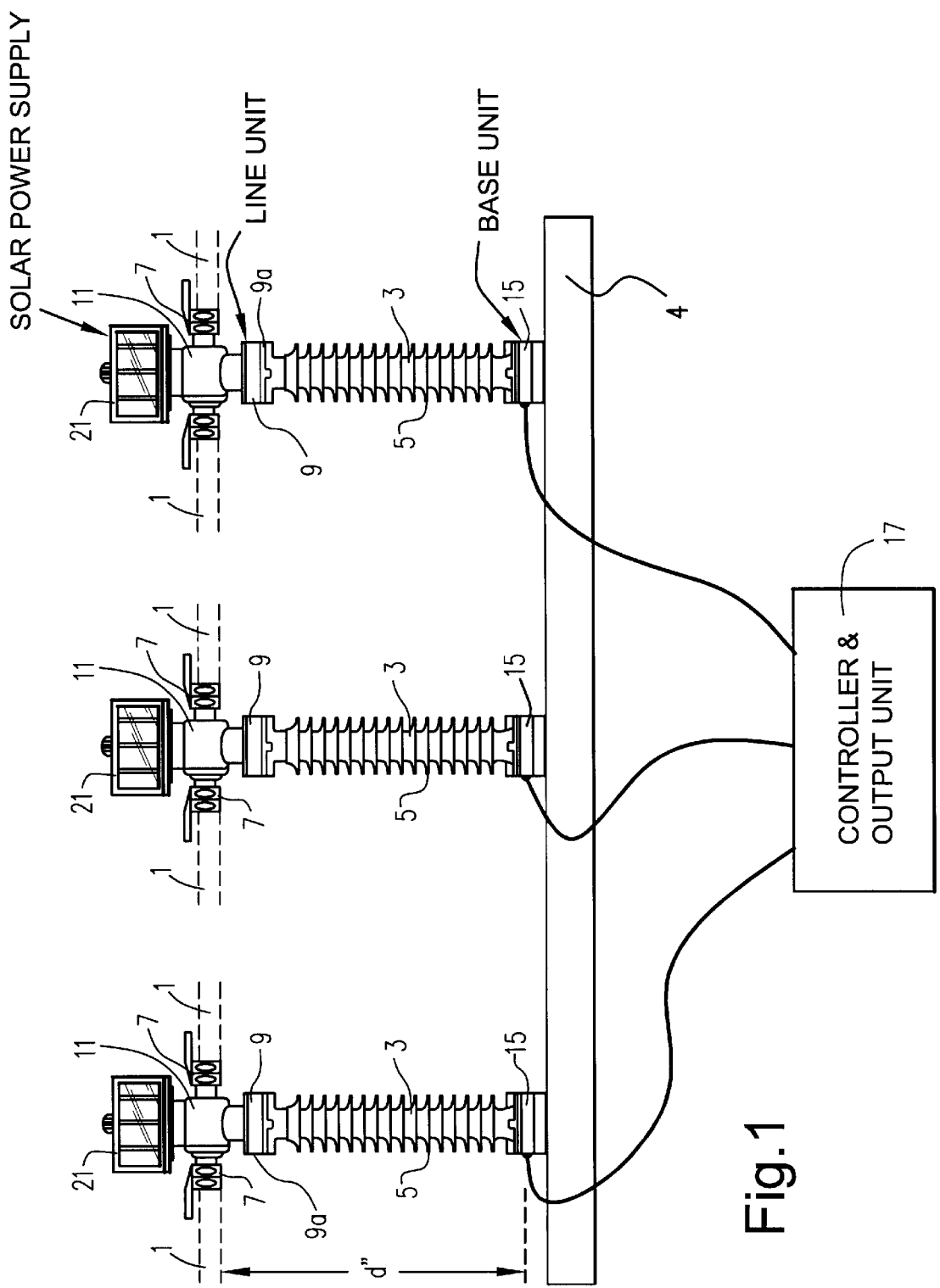
FIG. 1 is a schematic diagram of a current/voltage monitoring system according to an embodiment of this invention.

FIG. 1 is a schematic diagram of an embodiment of this invention. As shown in FIG. 1, three different phases or power lines 1 are provided, each on a different composite high voltage insulator 3 on support 4. High voltage insulators 3 are known in the art, and often include a series of fins or skirts 5 along their respective lengths. At the high potential or top end of each insulator 3, a pair of terminal connectors 7 are provided and to each of which a power line 1 is attached. It is noted that connectors 7 in FIG. 1 are illustrated 90 degrees turned from their normal positions, for purposes of simplicity and illustration.

A current sensing line unit 9 is provided at the high potential end of each high voltage insulator 3, for sensing electrical current in the corresponding power line 1. For example, a current sensing coil 27 (e.g., Rogowski coil) of line unit 9 may be provided in the form of a ring located around aluminum tube 11 disposed between the opposing terminal connectors 7 of each insulator 3, while the circuit board 9a of line unit 9 may be provided below connectors 7.

A voltage sensing base unit 15 is provided at the low or ground potential end of each high voltage insulator 3. Voltage sensing base unit 15 is thus spaced from the power line 1 to be monitored for each phase. In particular, base unit 15 may be located a distance "d" from the power line 1 to be monitored, where distance "d" may be from about 10–120 inches in different embodiments of this invention. As will be appreciated more fully below, each high voltage insulator 3 is hollow and allows fiber optic line(s) to run therein which couple the line 9 and base 15 units on each insulator 3 to one another. As can be further seen in FIG. 1, controller and output unit 17 is in communication with the current/voltage sensing circuitry for each phase (i.e., for each high voltage insulator 3).

Figure 2:
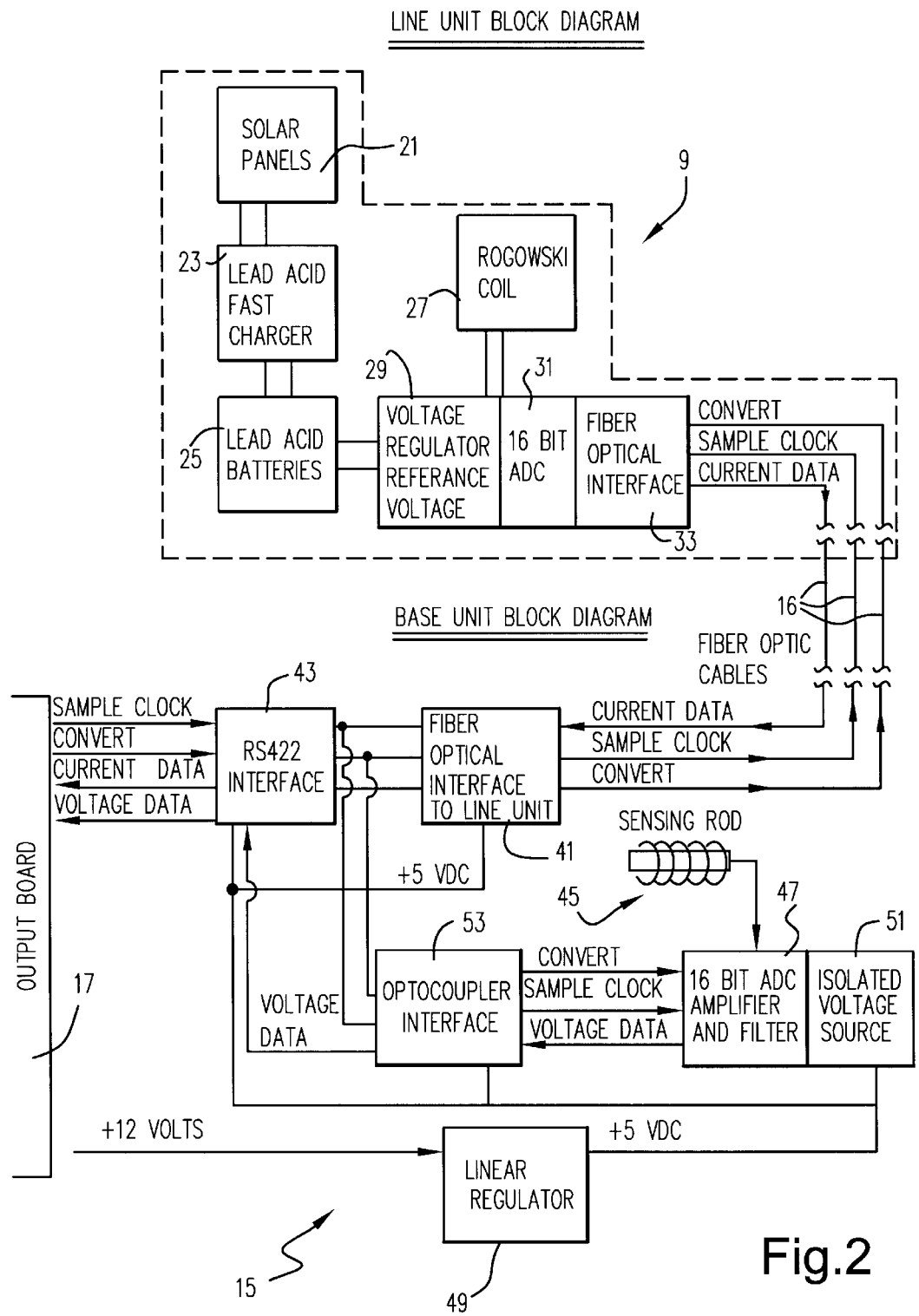
FIG. 2 is a block diagram of the line unit and the base unit of the FIG. 1 embodiment.

Referring to FIG. 2, the current sensing line unit 9 for each of the three phases includes solar power panel(s) 21, lead acid charger 23, lead acid battery(ies) 25, current sensing coil (e.g., Rogowski coil) 27, voltage regulator 29, analog-to-digital converter (ADC) 31, and fiber optic interface 33. As can be seen, the solar powered battery voltage source at the high potential end of the insulator 3 includes a plurality (e.g., three) of lead acid batteries (other battery types may of course instead be used) connected in series to provide a power source (e.g., 6 volt source). Charger 23 is for keeping the battery(ies) 25 fully charged via output from panels 21 due to incoming sunlight. In certain embodiments, line unit 9 may function for at least 10 days without sunlight, more preferably at least 30 days without sunlight. The power source including elements 21, 23, and 25 for the current sensing line unit 9 is advantageous in that it generates power at the high potential end of the insulator 3 for each phase. Moreover, it eliminates the need to generate power at the bottom of the power line pole or support (from a practical viewpoint, copper wiring cannot be run up through insulator 3 from the ground potential to the high potential end).

Still referring to FIG. 2, for each phase coil 27 is provided around the power line 1 as discussed above for sensing current change therein. Coil 27 (e.g., Rogowski coil, or any other suitable current sensing coil) produces a voltage output which is proportional (directly or otherwise) to the rate of current change in the corresponding power line 1. In example embodiments where a Rogowski coil is used, the output voltage waveform may be the cosine (COS) of the current waveform. Rogowski coils are used in certain embodiments, because they provide linear and stable voltage output. The voltage output from current sensing coil 27 is converted into a digital value by analog-to-digital converter (ADC) 31 (e.g., to a 16 bit digital value in certain example embodiments). In one example embodiment, the waveform may be sampled 6,956 times per second (based on the sample clock signal received from controller 17 via base unit 15). This high sampling rate at 16 bits provides for a very accurate reproduction of the current waveform. The digital data is buffered and transmitted to base unit 15 via fiber optic interface 33 and corresponding fiber optic cable(s) 16 that run(s) through the hollow interior of the corresponding high voltage insulator 3. The sampling clock (which provides the sampling signal to units 9 and 15 via fiber optic cable(s)) and the conversion rate (which provides the convert signals to units 9 and 15 via fiber optic cable(s)) are controlled and output by central controller 17.

As shown in FIG. 2, voltage sensing base unit 15 includes fiber optic interface 41 for enabling communication with current sensing line unit 9, interface 43 for enabling communication with central controller 17, electromagnetic radiation sensing rod 45 for sensing voltage from the corresponding power line 1, analog-to-digital converter (ADC) 47, linear regulator 49, isolated voltage source 51, and optocoupler interface 53. The base or circuit board of unit 15 receives its sampling clock and convert signals from central controller 17 via interface 43 (e.g., RS422 interface, or any other suitable interface). The sampling clock and conversion (i.e., convert) rate signals are converted from RS422 to fiber optical signals at 41, 43, and sent to the circuit board of the line unit 9 via fiber optic cable(s) 16. The same sampling clock and conversion signals are also used by unit 15 and potential sensor 45 therein; so that there is a common or constant time relationship between the current waveforms in unit 9 and the potential waveforms in unit 15. The current data received by unit 15 from unit 9, and the potential data (i.e., voltage data) generated by unit 15 are converted to RS422 signal levels at 43, and thereafter sent to controller 17.

Potential sensor 45 detects/senses the electromagnetic field generated by the high voltage in the corresponding power line 1 (from which the sensor 45 is spaced a distance "d"), and converts the electromagnetic energy into a voltage which is proportional (directly or otherwise) to the potential source. This voltage waveform output from sensor 45 is converted into a digital value by ADC 47 (e.g., into a 16 bit digital value). The waveform is sampled at 6,956 times per second in certain example embodiments of this invention. This high sampling rate at 16 bits provides an accurate reproduction of the potential waveform. The resulting digital data indicative of power line voltage (i.e., "voltage data") is buffered and transmitted to interface 43 via optocoupler interface 53. From interface 43, the digital data indicative of power line voltage (i.e., "voltage data") is sent to central controller 17 as shown in FIG. 2.

Regarding power, base unit 15 in certain example embodiments may require an average of about 100 mill amperes. The controller 17 may provide +12 volts as shown in FIG. 2, which may be converted to +5 volts by regulator 49 for powering the isolated potential voltage sensing circuitry, the optical circuitry, and the interfaces of unit 15.

Figure 3:
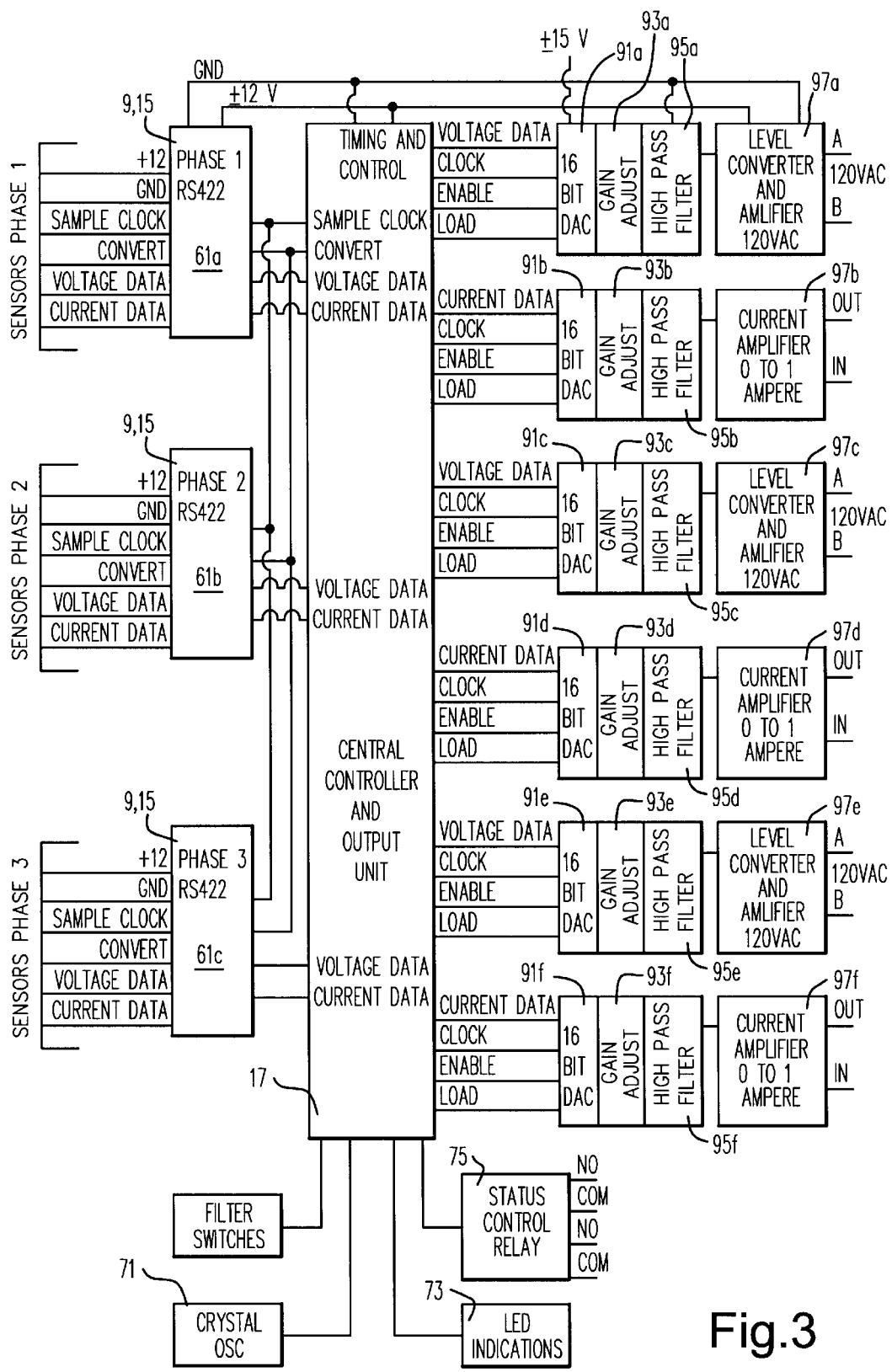
FIG. 3 is a block diagram of the control or output unit of the FIGS. 1–2 embodiment, wherein the control or output unit is coupled to and in communication with each of the line and base units.

FIG. 3 is a block diagram illustrating how central controller or output unit 17 controls and interacts with the current sensing line units 9 and the voltage sensing base units 15 for each of the three phases. The block 61a ("phase 1") in FIG. 3 is for communicating with both line unit 9 and base unit 15 for the first phase (i.e., for a first power line 1); while the block 61b ("phase 2") in FIG. 3 is for communicating with both line unit 9 and base unit 15 for the second phase (i.e., for a second power line 1); and the block 61c ("phase 3") is for communicating with both line unit 9 and base unit 15 for the third phase (i.e., for a third power line 1). The +12 signals, sample clock signals, ground signals, and convert signals from interface blocks 61 (e.g., RS422 interfaces) are provided to voltage sensing base unit 15 (see FIG. 2) for each corresponding phase, with the unit 15 thereafter also sending the clock and convert signals to the corresponding current sensing unit 9. Meanwhile, the current and voltage signals from units 9, 15 are received by blocks 61.

As shown in FIG. 3, communications between controller 17 and sensors 9, 15 are done via interfaces 61 (e.g., RS422 interfaces, or any other suitable type of interface(s)). The same sampling and conversion signals provided by controller 17 are used by both current sensing line units 9 and voltage sensing base units 15 (in all phases). This insures a constant time relationship between the potential and current waveforms.

Central controller 17 (e.g., CPU and/or programmable logic circuit) uses crystal oscillator 71 for clocking purposes. Each of the three current sensing line unit 9 inputs (i.e., "current data") and each of the three voltage sensing base unit 15 inputs (i.e., "voltage data") is monitored by controller 17 for a correct data format. For example, if a number (e.g., four) of sequential or consecutive incorrect data formats are detected, LED 73 status indicator(s) is illuminated and status relay 75 is deenergized. Likewise, each current and potential output amplifier may be monitored for save operating limits, and if unsafe condition(s) is/are detected the LED 73 status indicator(s) is illuminated and status relay 75 deenergized. As can be seen, in certain embodiments the system is programmable for monitoring the number of phases (e.g., three) and the number of current and voltage sensors (e.g., six altogether when three phases are being monitored). A programmable filter/threshold detection circuit may limit low levels of ground loop current (s) and small voltage fluctuations.

An example of how controller 17 operates is as follows. Serial data from the first phase (first power line) current sensing line unit 9, and serial data from the first phase voltage sensing base unit 15 is received by interface 61a. This serial digital data is converted from RS422 format, and forwarded to controller 17.

From controller 17, the first phase voltage data is forwarded to digital-to-analog converter (DAC) 91a (e.g., 16 bit DAC). After conversion to analog, the analog voltage signal for the first phase is level shifted, gain adjusted (see gain adjuster 93a), filtered (see high pass filter 95a), and converted to 120VAC (see amplifier/AC converter 97a). As can be seen in FIG. 3, DACs 91c and 91e handle the voltage signals in a similar manner for the other two phases, gain adjusters 93c and 93e handle gain adjustment in a similar manner for the other two phases, high pass filters 95c and 95e handle filtering in a similar manner for the other two phases, and amplifiers/converters 97c and 97e handle AC conversion in a similar manner for the other two phases.

From controller 17, the first phase current data is forwarded to digital-to-analog converter (DAC) 91b (e.g., 16 bit DAC). After conversion to analog, the analog current signal for the first phase is level shifted, gain adjusted (see gain adjuster 93b), filtered (see high pass filter 95b), and amplified/converted to 0 to 1 ampere (see current amplifier 97b) to provide output. As can be seen in FIG. 3, DACs 91d and 91f handle the current signals in a similar manner for the other two phases, gain adjusters 93d and 93f handle gain adjustment of the current signals in a similar manner for the other two phases, high pass filters 95d and 95f handle current signal filtering in a similar manner for the other two phases, and current amplifiers 97d and 97f handle current amplifying in a similar manner for the other two phases. In certain embodiments, each current sensor may be matched to its gain to provide an initial accuracy of a predetermined amount (e.g., 0.3% or any other suitable amount). In certain embodiments, each phase may have a manual gain adjustment for field calibration.

The aforesaid embodiment(s) illustrate and describe circuitry which is provided for purposes of example only. Other circuitry, or software implementations, may also be used and are intended to be covered by this invention.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A system for simultaneously sensing current and voltage for a plurality of different phases, the system comprising:
    a first current sensing unit and a first voltage sensing unit for a first power line to be monitored, wherein said first current sensing unit and said first voltage sensing unit communicate with one another optically;
    said first current sensing unit mounted proximate a first end of a first high voltage insulator and said first voltage sensing unit mounted proximate a second end of said first high voltage insulator so that said first current sensing unit senses current of said first power line and said first voltage sensing unit senses voltage of said first power line;
    a second current sensing unit and a second voltage sensing unit for a second power line to be monitored, wherein said second current sensing unit and said second voltage sensing unit communicate with one another optically;
    said second current sensing unit mounted proximate a first end of a second high voltage insulator and said second voltage sensing unit mounted proximate a second end of said second high voltage insulator so that said second current sensing unit senses current of said second power line and said second voltage sensing unit senses voltage of said second power line;
    a controller in communication with each of said first and second current sensing units and each of said first and second voltage sensing units; and
    wherein said controller outputs sampling signals to each of said first and second current sensing units and each of said first and second voltage sensing units so that current and voltage measurements from each of said first and second power lines are in phase with one another.

2. The system of claim 1, wherein power is supplied to each of said first and second voltage sensing units by said controller, and wherein power is supplied to each of said first and second current sensing units by a separate power source.

3. The system of claim 2, wherein the separate power source comprises at least one battery that is rechargeable via at least one solar panel.

4. The system of claim 1, wherein each of said current sensing units comprises a current sensing coil positioned around the corresponding power line, and wherein said first current sensing unit and said first voltage sensing unit communicate with one another optically via at least one optical cable provided in a hollow interior of said first high voltage insulator.

5. The system of claim 4, wherein said current sensing coil comprises a Rogowski coil.

6. The system of claim 1, wherein the first voltage sensing unit is located between the first current sensing unit and controller, so that current data output by said first current sensing unit passes through said first voltage sensing unit before being forwarded to the controller; and
    wherein the second voltage sensing unit is located between the second current sensing unit and controller, so that current data output by said second current sensing unit passes through said second voltage sensing unit before being forwarded to the controller.

7. The system of claim 6, wherein each of said current sensing units comprises: an analog-to-digital converter for converting analog current-indicative signals received from a current sensing coil to digital current-indicative signals, and an optical interface for converting the current-indicative signals into optical format for sending to the corresponding voltage sensing unit.

8. A system for simultaneously sensing current and voltage of at least one power line supported by a high voltage insulator, the system comprising:

a first current sensing unit and a first voltage sensing unit for a first power line to be monitored, said first current sensing unit and said first voltage sensing unit communicating with one another optically;

said first current sensing unit mounted proximate a high potential end of the high voltage insulator and said first voltage sensing unit mounted in a spaced relation to said high potential end of the high voltage insulator, so that said first current sensing unit senses current of the first power line and said first voltage sensing unit senses voltage of the first power line;

a controller that outputs sampling signals to each of said first current sensing unit and said first voltage sensing unit so that the current and voltage sensing units are in phase with one another.

9. The system of claim 8, wherein power is supplied to said first voltage sensing unit by said controller, and wherein power is supplied to said first current sensing unit by a separate power source.

10. The system of claim 9, wherein the separate power source comprises at least one battery that is rechargeable via at least one solar panel, said solar panel being supported by said high voltage insulator.

11. The system of claim 8, wherein said first current sensing unit and said first voltage sensing unit communicate with one another optically via at least one optical cable provided in a hollow interior of said high voltage insulator.

12. The system of claim 8, wherein said first voltage sensing unit is mounted at a low potential end of the high voltage insulator opposite the high potential end of said insulator.

13. A method of sensing current, the method comprising:

providing a current sensing unit for a phase to be monitored;

the current sensing unit sensing a current of the phase and converting analog current data to digital current data;

forwarding the digital current data to a potential sensing unit via at least one optical interface; and transmitting the digital current data from the potential sensing unit to a control unit via at least one communications interface.

14. The method of claim 13, further comprising:

the control unit transmitting sampling and conversion signals to at least the potential sensing unit and the current sensing u nit so that the current sensing unit and the potential sensing unit are in phase with one another.

15. The method of claim 13, wherein said current sensing unit and said potential sensing unit communicate with one another optically via at least one optical fiber or cable located in a hollow portion of a high voltage insulator on which the current sensing unit is mounted.

16. The method of claim 13, further comprising supplying power to the potential sensing unit via the control unit, and supplying power to the current sensing unit by a separate power source.

17. The method of claim 16, wherein the separate power source comprises at least one solar panel and at least one battery.

18. A system for simultaneously sensing current and voltage for a plurality of different phases, the system comprising:

a first line unit and a first base unit for a first power line to be monitored, wherein said first line unit and said first base unit communicate with one another optically;

said first line unit mounted proximate a first end of a first high voltage insulator and said first base unit mounted proximate a second end of said first high voltage insulator so that said first line unit senses current of said first power line and said first base unit senses voltage of said first power line;

a second line unit and a second base unit for a second power line to be monitored, wherein said second line unit and said second base unit communicate with one another optically;

said second line unit mounted proximate a first end of a second high voltage insulator and said second base unit mounted proximate a second end of said second high voltage insulator so that said second line senses current of said second power line and said second base unit senses voltage of said second power line;

a controller in communication with each of said first and second line units and each of said first and second base units; and wherein said controller outputs sampling signals to each of said first and second line units and each of said first and second base units so that current and voltage measurements from each of said first and second power lines are in phase with one another.

* * * * *

UNITED STATES PATENT AND TRADEMARK OFFICE
CERTIFICATE OF CORRECTION

| | | |
|---|---|---|
| PATENT NO. | : 6,522,256 B2 | Page 1 of 1 |
| APPLICATION NO. | : 09/854898 | |
| DATED | : February 18, 2003 | |
| INVENTOR(S) | : Panto et al. | |

It is certified that error appears in the above-identified patent and that said Letters Patent is hereby corrected as shown below:

Title page, item (73) Assignee, should read as follows: Southern Electrical Equipment Company Signed and Sealed this
Twenty-seventh Day of September, 2011

David J. Kappos
*Director of the United States Patent and Trademark Office*